(12) United States Patent
Gonapati et al.

(10) Patent No.: US 11,831,276 B1
(45) Date of Patent: Nov. 28, 2023

(54) RC OSCILLATOR WITH COMPENSATION DELAY

(71) Applicant: Samsung Electronics Co., Ltd., Suwon-si (KR)

(72) Inventors: Kishan Reddy Gonapati, Bangaluru (IN); Aswani Aditya Kumar Tadinada, Bengaluru (IN)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/959,795

(22) Filed: Oct. 4, 2022

(30) Foreign Application Priority Data

Jun. 6, 2022 (IN) .............................. 202241032216

(51) Int. Cl.
*H03B 5/24* (2006.01)
(52) U.S. Cl.
CPC ..................... *H03B 5/24* (2013.01)
(58) Field of Classification Search
CPC ......... H03B 5/24; H03K 3/011; H03K 3/0231
See application file for complete search history.

(56) References Cited

U.S. PATENT DOCUMENTS

| | | | |
|---|---|---|---|
| 9,385,649 B2 | 7/2016 | Wang et al. | |
| 10,693,443 B1 * | 6/2020 | Golara | .................. H03K 3/0231 |
| 2020/0328734 A1 * | 10/2020 | Colles | ...................... H03K 4/50 |

OTHER PUBLICATIONS

Wang et al., "A 255nW 138KHz RC Oscillator for Ultra-low Power Applications," 2016 IEEE MTT-S International Wireless Symposium (IWS), Mar. 14-16, 2016.
Paidimarri et al., "A 120nW 18.5kHz RC Oscillator with Comparator Offset Cancellation for ±0.25% temperature stability," 2013 IEEE International Solid-State Circuits Conference Digest of Technical Papers, Feb. 17-21, 2013.
Cao et al., "A 63,000 Q-Factor Relaxation Oscillator with Switched-Capacitor Integrated Error Feedback," IEEE International Solid-State Circuits Conference Digest of Technical Papers, Feb. 2013.

(Continued)

*Primary Examiner* — Jeffrey M Shin
(74) *Attorney, Agent, or Firm* — Harness, Dickey & Pierce, P.L.C.

(57) ABSTRACT

According to at least some example embodiments of the inventive concepts, an RC oscillator includes an oscillator core including a timing-circuit that includes a plurality of matched current sources, a plurality of capacitors, and a resistor, a first continuous time comparator, and a Schmitt trigger; and an analog circuit connected to the oscillator core including a second continuous time comparator representing a replica of the first continuous time comparator, and an EX-OR gate, wherein the analog circuit is configured to pass a clock signal of the oscillator core through the second continuous time comparator and obtaining a delayed clock signal representing a comparator delay, extract the comparator delay of the first continuous time comparator based on feeding the clock signal and the obtained delayed clock signal to the EX-OR gate, and charge the plurality of capacitors connected to the first continuous time comparator.

11 Claims, 10 Drawing Sheets

(56) References Cited

OTHER PUBLICATIONS

Tokunaga et al., "An On-Chip CMOS Relaxation Oscillator With Power Averaging Feedback Using a Reference Proportional to Supply Voltage," 2009 IEEE International Solid-State Circuits Conference, Feb. 11, 2009, pp. 404-406.

Paidimarri et al., "An RC Oscillator With Comparator Offset Cancellation," *IEEE Journal of Solid-State Circuits,* vol. 51, No. 8, Aug. 2016, pp. 1866-1877.

\* cited by examiner

RC OSCILLATOR WITH COMPENSATION DELAY

CROSS-REFERENCE TO RELATED APPLICATION

This application is based on and claims priority under 35 U.S.C. § 119 to Indian Patent Application No. 202241032216, filed on Jun. 6, 2022 in the Indian Intellectual Property Office, the entire disclosure of which is incorporated by reference herein.

BACKGROUND

1. Field

At least some example embodiments of the inventive concepts relate to oscillators and in particular, relates to cancellation of offset and delay within resistance-capacitance (RC) oscillators.

2. Related Art

Oscillators and timers are frequently used in many systems with the frequency, accuracy, stability specifications being dependent on the application. Some relatively low duty cycle systems such as operating with a timing clock of only 12.8 Hz, may have very intermittent activity, and achieve an average power of about 1 nW. On the other hand, standards-based wireless systems often use accurate, low power timers to maintain protocol-level timing to ensure the radios are turned on at the right times. The desire for high-accuracy oscillators is evident based on, for example, the operation of slave sensor nodes in connected modes of Bluetooth Low Energy (BLE) or Institute of Electrical and Electronic Engineers (IEEE) 802.15.4 networks, especially at low duty cycles. These sensor nodes wake up periodically to receive beacons to synchronize transmissions.

Oscillators are used in many different types of electronic devices. For example, oscillators can be used in devices that may implement a function of recovering from sleep to an active mode, examples of which include, but are not limited to, mobiles (e.g., mobile phones, mobile devices, etc.), audio devices (e.g., wireless speakers, wireless headphones/earbuds, etc.), TVs, computers (e.g., desktop computers, laptops, tablets, etc.), wearable devices (e.g., smart watches, smart rings/bracelets/pendants, other smart jewelry, etc.), and internet of things (IoT) devices. Specifically, in applications like IoT devices and audio devices where a function of moving from a sleep mode to an active mode of operation may be implemented using a clock, reducing or, alternatively, minimizing the oscillator power will reduce the sleep power (e.g., power consumption in sleep mode). Temperature stability of oscillator frequency can be important for reducing or, alternatively, minimizing timing uncertainty in digital circuits. In frequencies of less than a 500 KHz, comparator-offset cancellation, e.g. based on an averaging technique, may be used. FIG. 1 & FIG. 2 show implementation and timing diagrams of comparator-offset cancellation. During Ø=zero, a second node voltage V2=I*R and a first voltage V1 at first node N1, where a capacitor is charged by a same matched current I, such that first voltage V1 crosses second voltage V2 at second node N2, at RC time and the output changes state post comparator delay. Vice versa for Ø=one. Here the period is $t_{period}=2RC+2t_{delay}$ (where, $t_{delay}$ is comparator delay). When operating at a frequency greater than 10 MHz, the comparator delay may be a substantial cause or, alternatively, the primary cause of inaccuracy in frequencies.

As may be observed, in resistance-capacitance (RC)oscillators, generally the comparator delay variation with process is trimmed but the drift with temperature and supply voltage may still remain. This variation with V & T may determine the frequency accuracy. Overall, comparator delay is often proportional to power.

FIG. 3A illustrates frequency variation with respect to comparator offset. FIG. 3B illustrates frequency variation with respect to comparator delay. As may be observed, the comparator offset moves the trip point of comparator which will increase or reduce the frequency depending, for example, on offset polarity. The finite comparator delay & its variation may lead to frequency of oscillation.

FIG. 4A illustrates that, for low power applications, $t_{delay}$ [i.e. the comparator delay] is more and a corresponding process, voltage temperature (PVT) spread may change the oscillator frequency away from desired value. The timeperiod may be calculated by following expression:

$$t_{\phi=0} = (I_2 R + V_{os}) + t_{delay}$$

$$t_{\phi=1} = (I_1 R - V_{os}) + t_{delay}$$

$$t_{period} = \left(\frac{I_2 RC_1}{I_1} + \frac{I_1 RC_2}{I_2}\right) + \left(\frac{C_1}{I_1} - \frac{C_2}{I_2}\right) * V_{os} + 2 * t_{delay}$$

FIG. 4B illustrates a timing diagram for explaining calculation of the t_delay with respect to FIG. 4A and represented by $$I1=I2$$

the $T_{period}=2RC+2t_{delay}$

Overall, it may be desirable to reduce or, alternatively, cancel comparator delay dependency on an RC relaxation oscillator to render it suitable for low-power applications.

It may be desirable to at-least improve the frequency-accuracy of the RC oscillator.

SUMMARY

According to at least some example embodiments of the inventive concepts, an RC oscillator includes an oscillator core including a timing-circuit that includes a plurality of matched current sources, a plurality of capacitors, and a resistor, a first continuous time comparator, and a Schmitt trigger; and an analog circuit connected to the oscillator core including a second continuous time comparator representing a replica of the first continuous time comparator, and an EX-OR gate, wherein the analog circuit is configured to pass a clock signal of the oscillator core through the second continuous time comparator and obtaining a delayed clock signal representing a comparator delay, extract the comparator delay of the first continuous time comparator based on feeding the clock signal and the obtained delayed clock signal to the EX-OR gate, and charge the plurality of capacitors connected to the first continuous time comparator with a same current during a time interval corresponding to the comparator delay by boosting input voltage signals to the first continuous time comparator to compensate the comparator delay with respect to the oscillator core.

According to at least some example embodiments, a method for compensating comparator offset and delay in an RC oscillator includes passing a clock signal of an oscillator core through an analog circuit and obtaining a delayed clock signal representing a comparator delay, said analog circuit being connected to the oscillator core and including a second continuous time comparator representing a replica of a first continuous time comparator present in the oscillator core, and an EX-OR gate; extracting a comparator delay of the first continuous time comparator based on feeding the clock signal and the obtained delayed clock signal to the EX-OR gate; and charging a plurality of capacitors connected to the first continuous time comparator with a same current during a time interval corresponding to the comparator delay by boosting first and second node voltage signals to the first continuous time comparator to compensate the comparator delay of the first continuous time comparator and offset with respect to the oscillator core.

At least some example embodiments of the inventive concepts relate to an RC Oscillator. According to at least some example embodiments, an oscillator core comprises a timing-circuit comprising a plurality of matched current sources I, capacitors C and a resistor R, a first continuous time comparator, and a Schmitt trigger. An analog circuit is connected to the oscillator core and comprises a second continuous time comparator representing a replica of the first continuous time comparator, and an EX-OR gate. The analog-circuit is configured to execute the steps of:

- passing a clock signal of the oscillator core through the replica comparator and obtaining a delayed clock signal representing a comparator delay;
- extracting the comparator delay of the first continuous time comparator based on feeding the clock signal and the obtained comparator delay to the EX-OR gate; and
- charging the plurality of capacitors connected to the first continuous time comparator with same current during a time interval ($t_{delay}$) corresponding to the comparator delay by boosting input voltage signals (V1/V2) to the first continuous time comparator to compensate the comparator delay with respect to the core oscillator.

At least some example embodiments of the inventive concepts relate to 49 MHz low power, RC Relaxation oscillator with comparator offset and comparator delay cancellation. With respect to high accuracy, low power & high frequency applications where the comparator delay is dominant, at least some example embodiments of the inventive concepts may provide a solution for cancelling the comparator delay.

Overall, at least some example embodiments of the inventive concepts employ a new analog loop to compensate for comparator delay along with comparator-offset cancellation. Comparator delay is proportional to power. At least some example embodiments of the inventive concepts employ a new analog loop to compensate for comparator delay along with comparator-offset cancellation. Overall, at least some example embodiments of the inventive concepts achieve a frequency that is independent of comparator delay and offset.

BRIEF DESCRIPTION OF FIGURES

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

Figure 1:
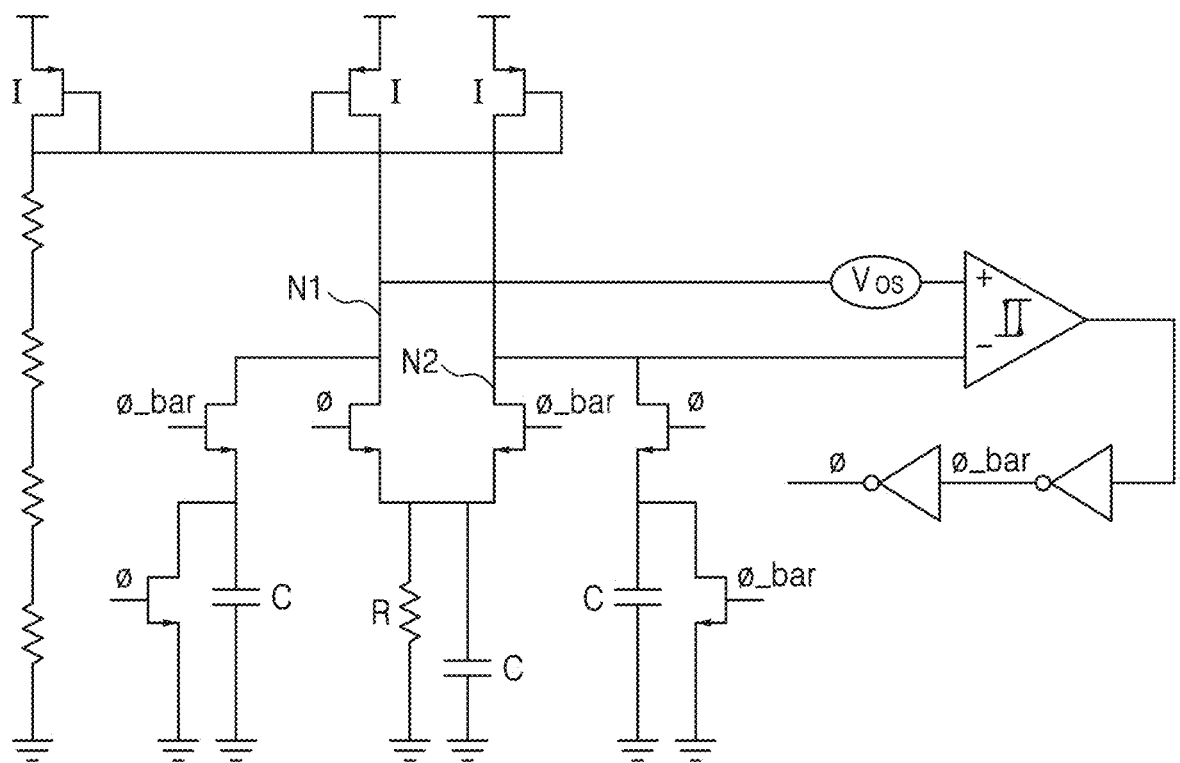
FIG. 1 illustrates an RC oscillator with offset compensation in accordance with a related art technique.
Figure 2:
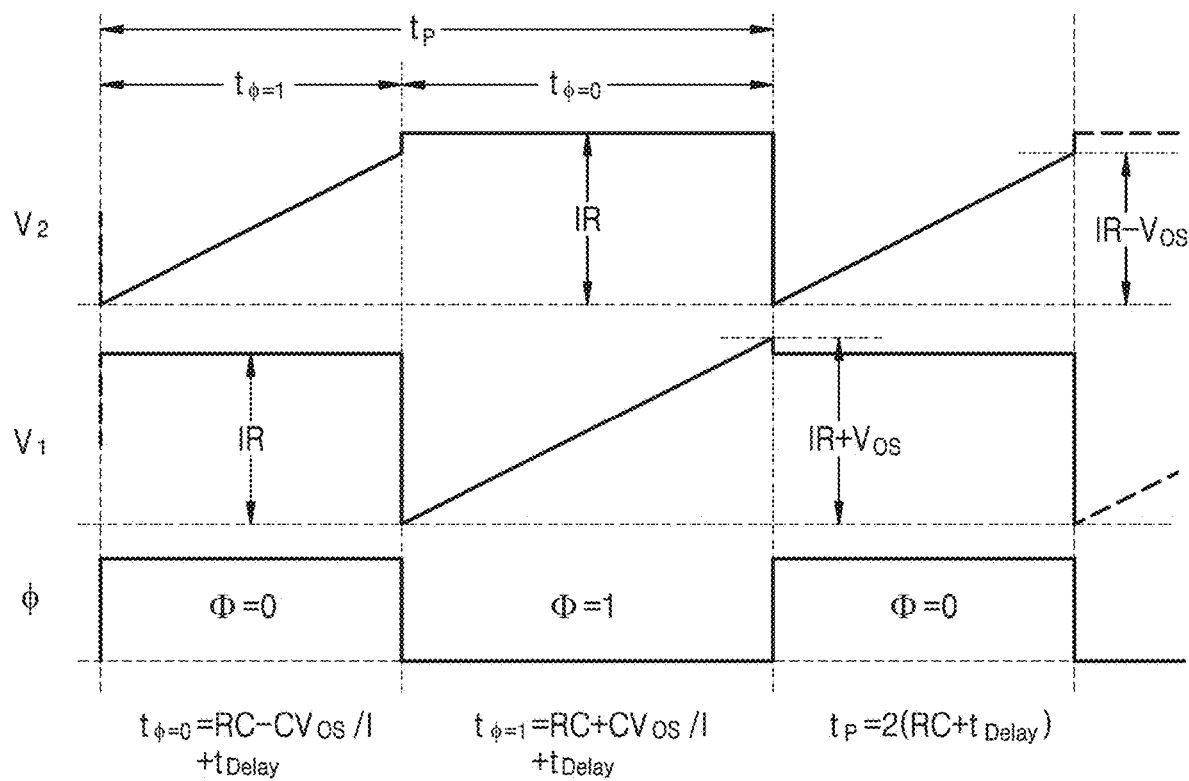
FIG. 2 illustrates a diagram showing an RC Oscillator showing the comparator delay variation, in accordance with a related art technique.
Figure 3A:
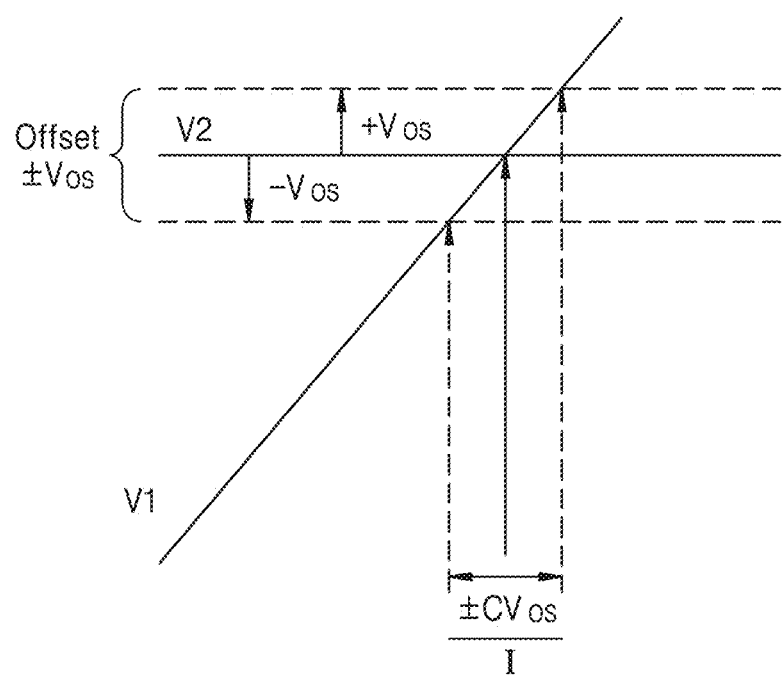
FIG. 3A illustrates a frequency variation with respect to comparator offset, in accordance with a related art technique.
Figure 3B:
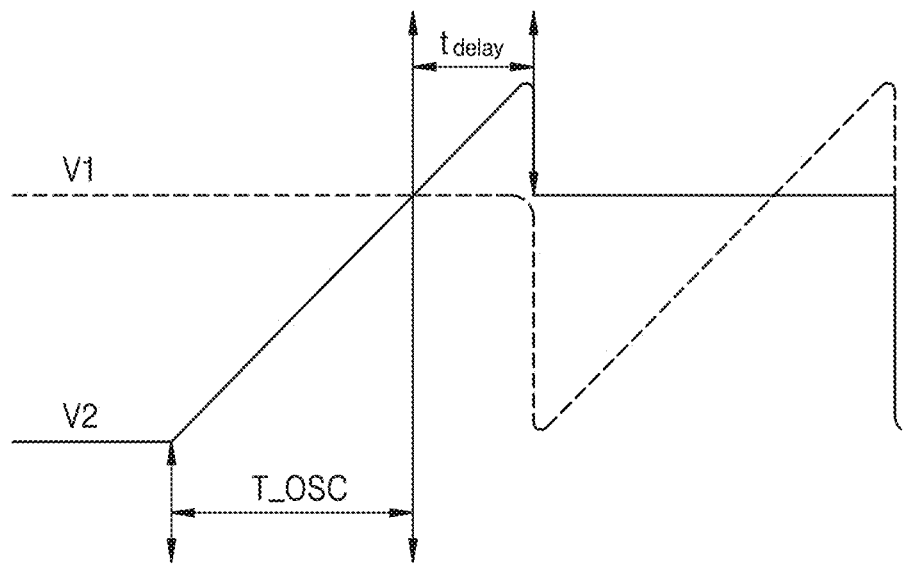
FIG. 3B illustrates a frequency variation with respect to comparator delay, in accordance with a related art technique.
Figure 4A:
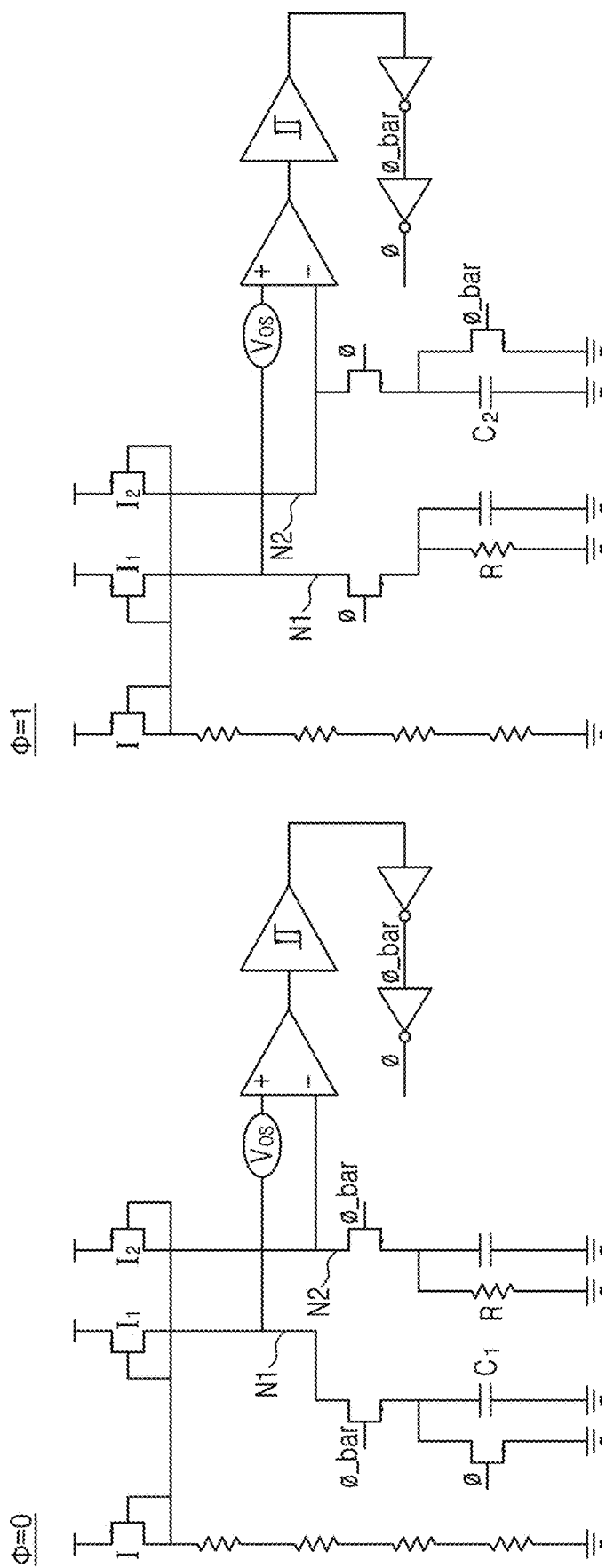
FIG. 4A illustrates a diagram showing the comparator delay trend for low power applications, in accordance with a related art technique.
Figure 4B:
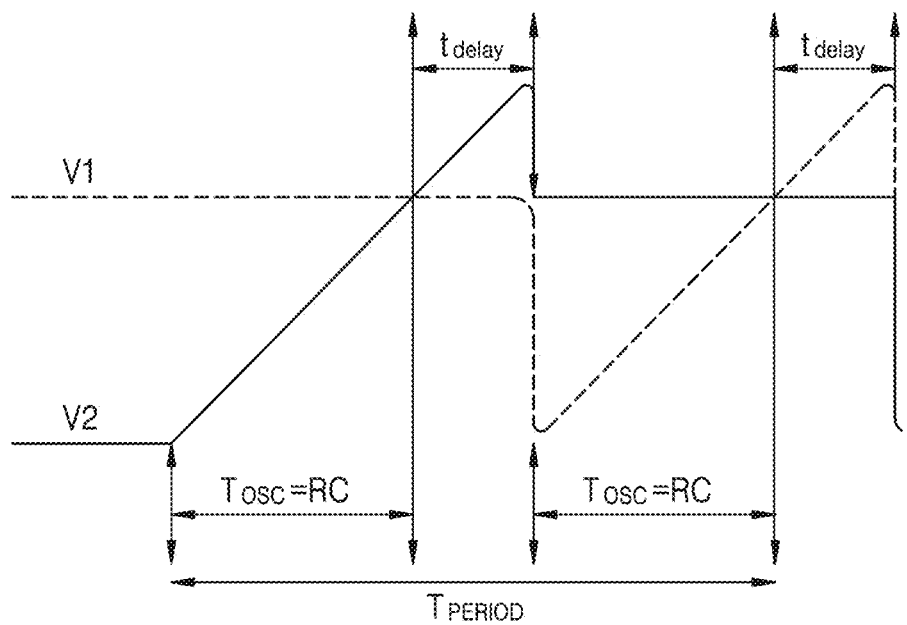
FIG. 4B illustrates a timing diagram showing calculation of the comparator delay with respect to FIG. 4A.

Further, skilled artisans will appreciate that elements in the drawings are illustrated for simplicity and may not have necessarily been drawn to scale. For example, the flow charts illustrate the method in terms of the most prominent steps involved to help to improve understanding of aspects of at least some example embodiments of the inventive concepts. Furthermore, in terms of the construction of the device, one or more components of the device may have been represented in the drawings by conventional symbols, and the drawings may show only those specific details that are pertinent to understanding at least some example embodiments of the inventive concepts so as not to obscure the drawings with details that will be readily apparent to those of ordinary skill in the art having benefit of the description herein.

DETAILED DESCRIPTION

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

Figure 5A:
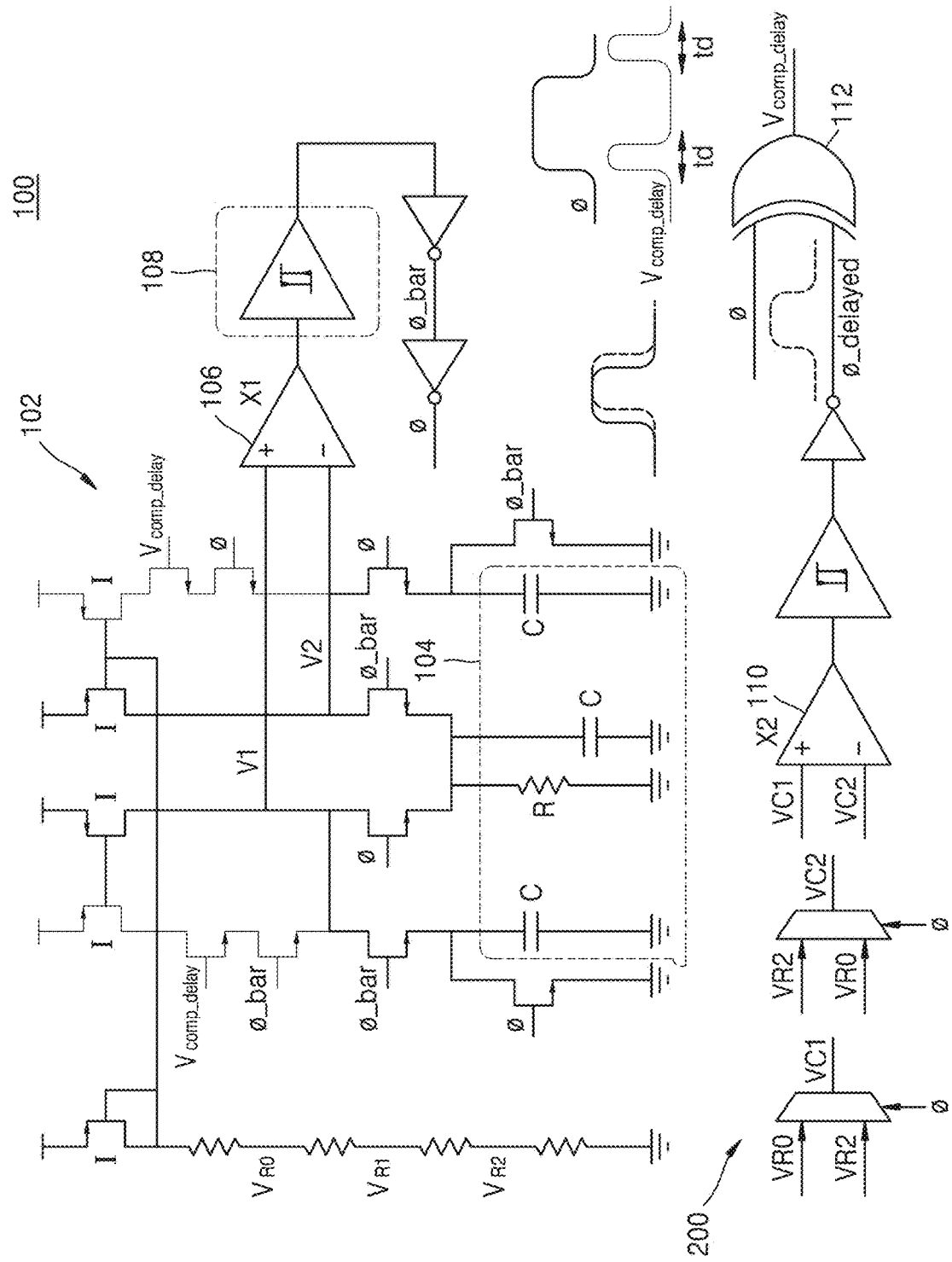
FIG. 5A illustrates a schematic circuit representation of an RC oscillator in accordance with at least one example embodiment of the inventive concepts.

FIG. 5A illustrates a schematic circuit representation of the RC oscillator 100, in accordance with at least one example embodiment of the inventive concepts.

The RC oscillator 100 comprises an oscillator core 102 comprising a timing-circuit 104. The timing circuit 104 comprises a plurality of matched current sources I, capacitors C and a resistor R. The core 102 further comprises a first continuous time comparator 106, and a Schmitt trigger 108.

The inputs for the first continuous time comparator 106 are defined by at-least one of:

a) a fixed current flowing through a resistor and generating a reference voltage [V1, V2], b) a fixed current charging the plurality of capacitors connected to the first continuous time comparator, c) a phase of operation defined by first and second node voltages V2=I*R & V1 being achieved by charging of the capacitor and thereby enabling first node voltage V1 crossing second node voltage V2 upon elapse of a time duration defined by a RC time constant and in turn enabling an output change post delay of the first comparator, and d) a complementary phase of operation defined by first and second node voltages V1=I*R & V2 being achieved by charging of the capacitor and thereby enabling second node voltage V2 crossing first node voltage V1 upon elapse of the time duration defined by the RC time constant and in turn enabling the output change post-delay of the first comparator 106. In an example, the first comparator 106 is configured to detect input difference based on a current charging the capacitor (ramp) and a fixed reference voltage.

The RC time constant may be computed as follows:

the $T_{total}=2RC$ wherein, reference voltage level, V1/V2=Vref=I*R. Further, according to at least some example embodiments of the inventive concepts, the voltages V1 and V2 are time multiplexed. For example, when clock signal Φ=0, V1 is the reference (e.g., for comparator 106) and equal to I*R, and V2 is the voltage that is ramping UP in this time. When clock signal Φ=1, V2 is the reference (e.g., for comparator 106) and equal to I*R, and V1 is a voltage that is ramping UP in this time. In the present specification, the terminology "V1/V2" is meant to refer to "reference voltage V1 and/or reference voltage V2" since, as is noted above, V1 and V2 each alternate (e.g., with opposite phases) between serving as the reference voltage (e.g., for the comparator 106) and the ramp up voltage in accordance with a state of the clock signal clock signal Φ.

The RC oscillator 100 may further comprises an analog circuit 200 connected to the oscillator core 102 and comprises a second continuous-time comparator 110 representing a replica of the first continuous-time comparator 106, and an EX-OR (e.g., XOR) gate 112. According to at least some example embodiments of the inventive concepts, the analog-circuit 200 is configured to execute the steps of:

a) passing a clock signal of the oscillator core 102 through the replica comparator 110 and obtaining a delayed clock signal representing a comparator delay;

b) extracting the comparator delay of the first continuous-time comparator 106 based on feeding the clock signal and the obtained comparator delay to the EX-OR gate 112; and c) charging the plurality of capacitors C connected to the first continuous-time comparator 106 with same current during a time interval (td) corresponding to the comparator delay by boosting input voltage signals (e.g., first and second node voltages V1/V2) to the first continuous-time comparator 106 to compensate the comparator delay with respect to the oscillator core 102.

The RC time constant may be computed as follows:

$$Vref = \frac{1}{C}\int_0^{Tosc} idt$$

$$Vref = \frac{1}{c}\int_0^{td} 2Idt + \frac{1}{c}\int_{td}^{Tosc} Idt$$

$$T_{OSC} = RC - T_{delay}$$

$$T_{total} = 2*(T_{OSC} + t_{delay})$$

$$T_{total} = 2*(RC - t_{delay} + t_{delay})$$

$$T_{total} = 2RC$$

Figure 5B:
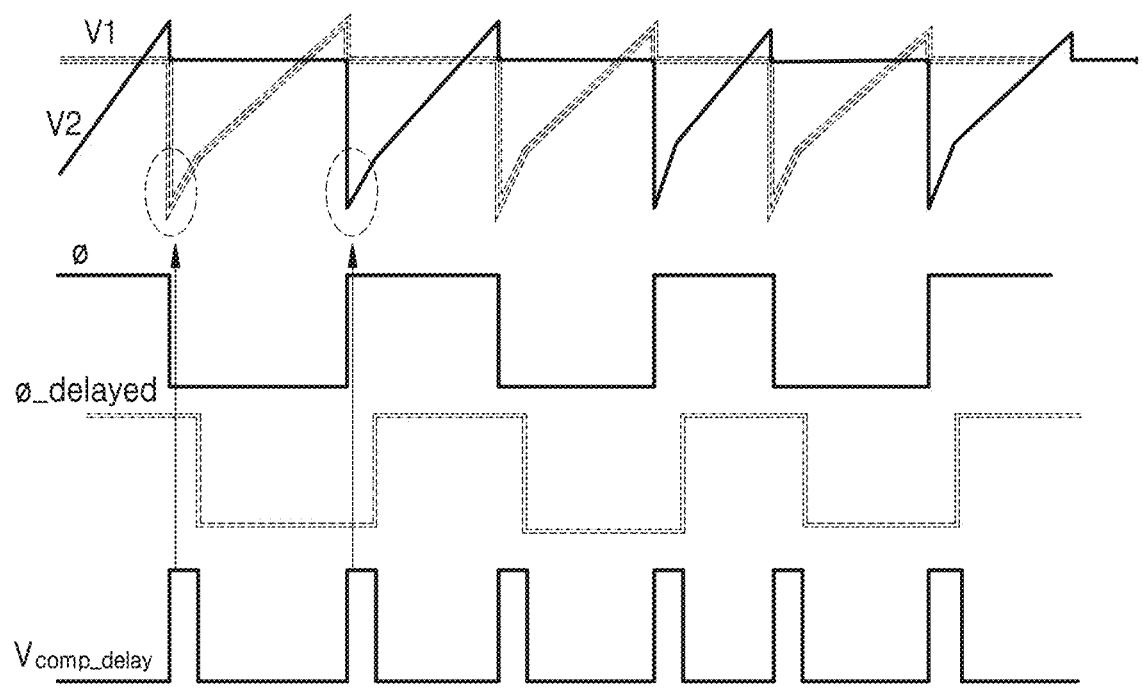
FIG. 5B illustrates a diagram showing the comparator delay between the clock signals Φ and Φ_delayed of a first and a second comparator, in accordance with at least one example embodiment of the inventive concepts.

FIG. 5B depicts the comparator delay between the clock signals Φ and Φ_delayed of first comparator 106 and the second comparator 110 as vcomp_delay.

Figure 6:
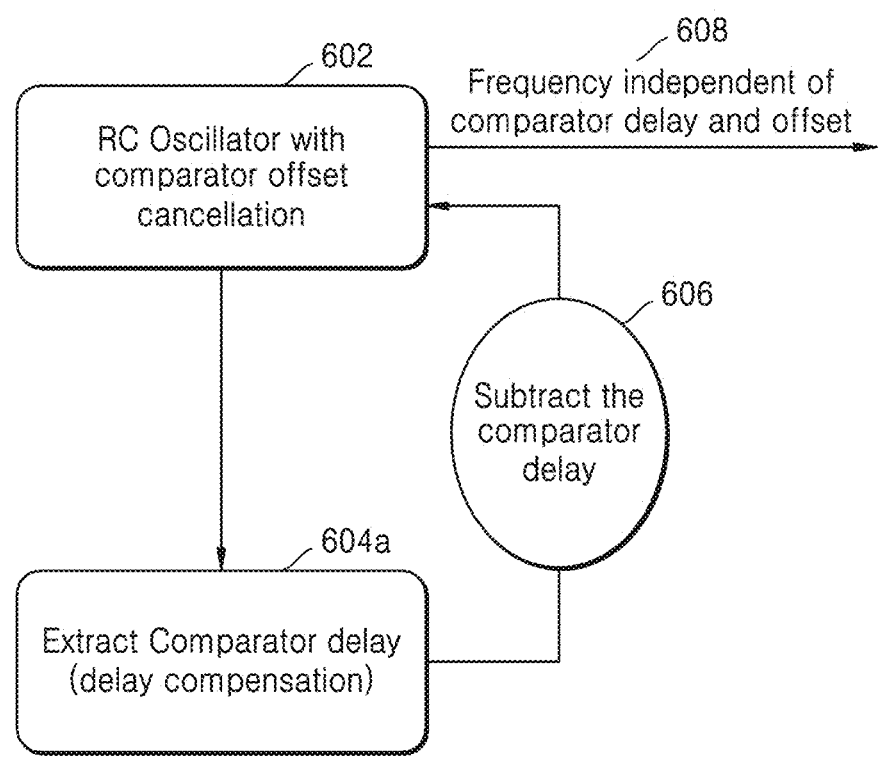
FIG. 6 illustrates a control-flow of operation of the arrangement as depicted in FIG. 5.

FIG. 6 illustrates a control-flow of operation of the arrangement as depicted in FIG. 5 and accordingly refers a method for method for compensating comparator offset and delay in the RC Oscillator 100.

Step 602 refers RC oscillator with comparator offset cancellation.

Step 604a refers extracting the comparator-delay of the first continuous-time comparator based on feeding the clock signal and the obtained comparator delay to the EX-OR gate.

Step 606 refers to charging the plurality of capacitors connected to the first continuous time comparator with same current during the time interval (td) corresponding to the comparator delay by boosting input voltage signals (e.g., first and second node voltages V1/V2) to the first continuous-time comparator to compensate the comparator delay and offset with respect to the core oscillator. The boosting of the voltage signals to the first comparator within the core oscillator causes shortening of the total time period to: $T_{total}$=2RC−2td+2td=2RC.

Step 608 refers obtaining a frequency independent of comparator-delay and offset.

Figure 7:
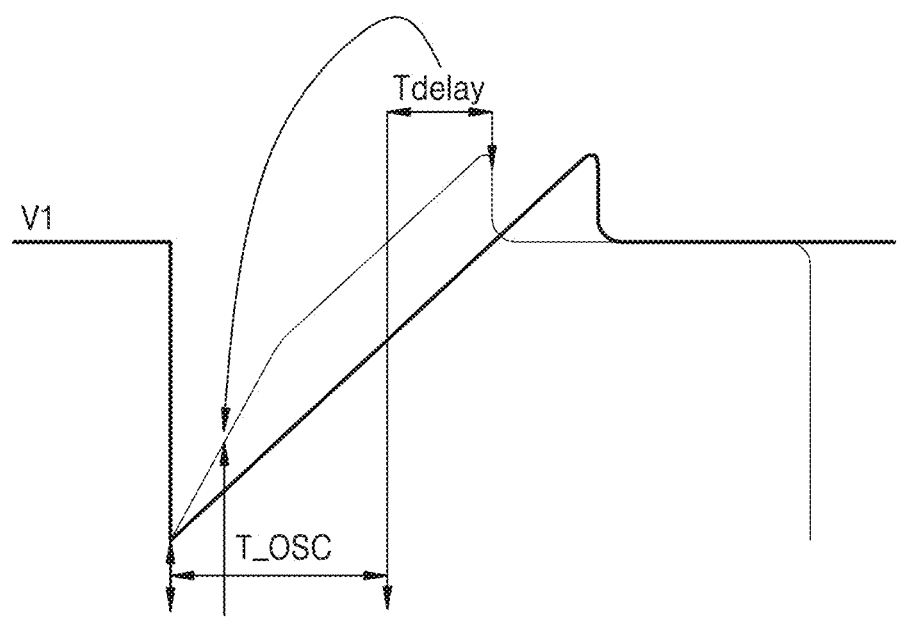
FIG. 7 illustrates a timing-diagram of comparator offset & delay cancellation in accordance with at least one example embodiment of the inventive concepts.
Figure 7:
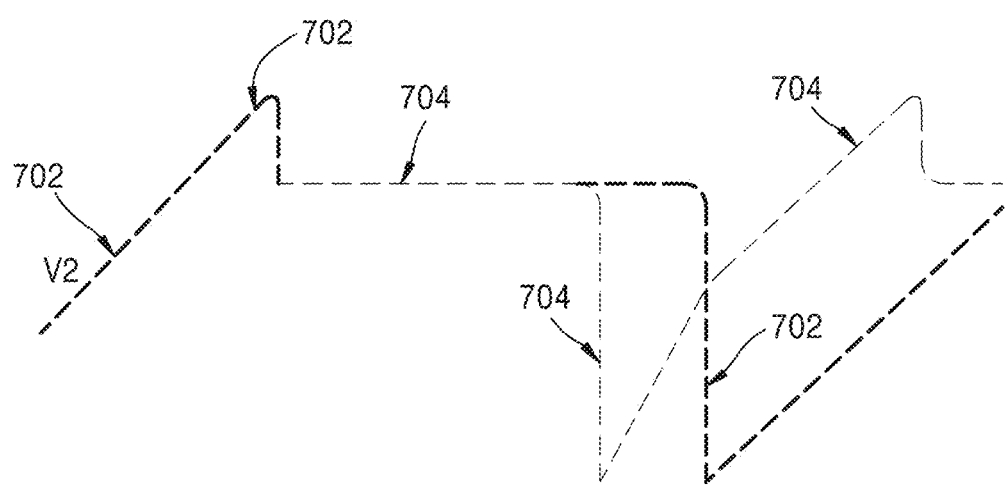
Figure 7:
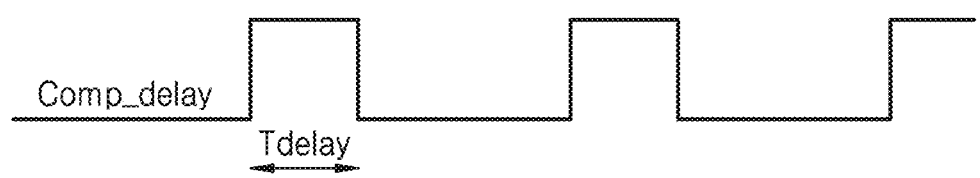

FIG. 7 illustrates a timing-diagram of comparator offset & delay cancellation in accordance with at least some example embodiments of the inventive concepts and refers the steps of FIG. 6. A timing waveform 702 refers to RC Oscillator with comparator offset cancellation and a timing waveform 704 refers to RC Oscillator with comparator offset and delay cancellation.

The first comparator 106 as in the oscillator core 102 is re-used for extracting the comparator delay. A relaxation oscillator clock is sent through the compensation loop replica comparator 110, the output is delayed by comparator delay. The clock and delayed version of clock from compensation loop is given to EX-OR gate 112 to extract the comparator propagation delay. So additional delay depends on the comparator delay and the comparator resolution. The core comparator 106 or the first comparator 106 sees an input difference based on a current charging the capacitor (ramp) and fixed reference voltage. The compensation path sees a step input and a fixed reference voltage. In order to match the delays for both comparators 106 and 110, the comparator gain is co. Irrespective of input types, when both comparators 106 and 110 see a small input difference, the comparators 106 and 110 start taking decision i.e., determining when voltages at a positive node and negative node of a comparator (e.g., comparator 106 and/or 110) are close to one another and the output of the comparator is transitioning from a high level to a low level (or, vice versa) and the delay will be dependent on the finite bandwidth.

With the extracted comp_delay ($t_{delay}$) the additional delay is compensated by boosting the V1/V2 signal by charging with same current during the td time. By doing this the comparator delay is substantially or, alternatively, completely cancelled. The same may be represented logically as follows:

$$Vref = \frac{1}{C}\int_0^{Tosc} idt$$

$$Vref = \frac{1}{c}\int_0^{td} 2Idt + \frac{1}{c}\int_{td}^{Tosc} Idt$$

$$T_{OSC} = RC - T_{delay}$$

$$T_{total} = 2*(T_{OSC} + t_{delay})$$

$$T_{total} = 2*(RC - t_{delay} + t_{delay})$$

$$T_{total} = 2RC$$

Wherein V1/V2 reference voltage level=Vref=I*R & $t_{delay}$ is the comparator delay.

As may be observed, the Total time period $T_{total}=2*(T_{osc}+t_{delay})$.

With comparator delay compensation, $T_{OSC}=RC-t_{delay}$. The total time period becomes $T_{total}=2*RC$. Hence, the comparator delay is substantially or, alternatively, completely canceled.

One or more of the elements disclosed above may include or be implemented in one or more processing circuitries such as hardware including logic circuits; a hardware/software combination such as a processor executing software; or a combination thereof. For example, the processing circuitries more specifically may include, but are not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Further, the elements of the RC oscillator 100 are not limited to the structural examples provided in the FIGS. (e.g., FIG. 5A) and may be embodied by other, different circuit structures. For example, one or more of the oscillator core 102, the timing circuit 104, the comparators 106 and 110, the analog circuit 200, or the Schmitt trigger 108 may be embodied by processing circuitries. Further, the processing circuitries may include any circuit structure capable of carrying out the functions described in the present specification as being performed by the oscillator core 102, the timing circuit 104, the comparators 106 and 110, the analog circuit 200, or the Schmitt trigger 108.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

We claim:

1. An RC Oscillator comprising:
   an oscillator core comprising:
      a timing-circuit comprising a plurality of matched current sources, a plurality of capacitors, and a resistor,
      a first continuous time comparator, and
      a Schmitt trigger; and
   an analog circuit connected to the oscillator core comprising:
      a second continuous time comparator representing a replica of the first continuous time comparator, and
      an EX-OR gate,
   wherein the analog circuit is configured to:
      pass a clock signal of the oscillator core through the second continuous time comparator and obtaining a delayed clock signal representing a comparator delay,
      extract the comparator delay of the first continuous time comparator based on feeding the clock signal and the obtained delayed clock signal to the EX-OR gate, and
      charge the plurality of capacitors connected to the first continuous time comparator with a same current during a time interval corresponding to the comparator delay by boosting input voltage signals to the first continuous time comparator to compensate the comparator delay with respect to the oscillator core.

2. The RC Oscillator of claim 1, wherein inputs for the first continuous time comparator are defined by at-least one of:
   a fixed current flowing through a resistor and generating a reference voltage,
   a fixed current charging the plurality of capacitors connected to the first continuous time comparator, and
   a phase of operation defined by a first node voltage and a second node voltage being achieved by charging a capacitor and thereby enabling the first node voltage to cross the second node voltage upon an elapsing of a time duration defined by an RC time constant and in turn enabling an output change post delay of the first continuous time comparator; and
   a complementary phase of operation defined by the first node voltage and the second node voltage being achieved by charging of a capacitor and thereby enabling the first node voltage to cross the second node voltage upon an elapsing of the time duration defined by the RC time constant and in turn enabling the output change post delay of the first continuous time comparator.

3. The oscillator of claim 1, wherein the first continuous time comparator is configured to detect an input difference based on a current charging a capacitor and a fixed reference voltage.

4. The oscillator of claim 1, wherein a period of the oscillator is defined by $t_{period}=2RC+2t_{delay}$, $t_{delay}$ corresponding to a comparator delay.

5. A method for compensating comparator offset and delay in an RC oscillator, said method comprising:
   passing a clock signal of an oscillator core through an analog circuit and obtaining a delayed clock signal representing a comparator delay, said analog circuit being connected to the oscillator core and comprising:

a second continuous time comparator representing a replica of a first continuous time comparator present in the oscillator core, and
an EX-OR gate;
extracting a comparator delay of the first continuous time comparator based on feeding the clock signal and the obtained delayed clock signal to the EX-OR gate; and
charging a plurality of capacitors connected to the first continuous time comparator with a same current during a time interval corresponding to the comparator delay by boosting first and second node voltage signals to the first continuous time comparator to compensate the comparator delay of the first continuous time comparator and offset with respect to the oscillator core.

6. The method of claim 5, wherein the first continuous time comparator is configured to detect an input difference based on a current charging a capacitor and a fixed reference voltage.

7. The method of claim 5, whereas the second continuous time comparator representing the replica receives a step input and a fixed reference voltage.

8. The method of claim 6, further comprising:
matching the comparator delay of the first continuous time comparator and a comparator delay of the second continuous time comparator to enable the first continuous time comparator to execute a decision with time efficiency irrespective of a magnitude of the input difference, said matching of the delays of the of the first and second continuous time comparators being done by choosing high gain comparators with finite bandwidth.

9. The method of claim 5, wherein a total time period of the core oscillator is $T_{total}=2(RC+td)$, said td representing the comparator delay and said RC representing a resistance capacitance.

10. The method of claim 9, wherein the boosting of the voltage signals to the first continuous time comparator within the core oscillator causes shortening of the total time period to: $T_{total}=2RC-2td+2td=2RC$.

11. The method of claim 10, wherein a cancelling of the comparator delay as a part of shortening of the total time period enables application of low power comparators within the RC oscillator for augmenting accuracy.

* * * * *